United States Patent
Yoshioka et al.

(10) Patent No.: US 9,039,865 B2
(45) Date of Patent: May 26, 2015

(54) PLASMA PROCESSING APPARATUS

(75) Inventors: Ken Yoshioka, Hikari (JP); Motohiko Yoshigai, Hikari (JP); Ryoji Nishio, Kudamatsu (JP); Tadayoshi Kawaguchi, Kudamatsu (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 1038 days.

(21) Appl. No.: 12/694,363

(22) Filed: Jan. 27, 2010

(65) Prior Publication Data
US 2011/0108194 A1    May 12, 2011

(30) Foreign Application Priority Data

Nov. 10, 2009 (JP) .................................. 2009-257312

(51) Int. Cl.
| | |
|---|---|
| H01L 21/306 | (2006.01) |
| C23C 16/00 | (2006.01) |
| H01J 37/32 | (2006.01) |

(52) U.S. Cl.
CPC ......... *H01J 37/32623* (2013.01); *H01J 37/321* (2013.01); *H01J 37/3211* (2013.01)

(58) Field of Classification Search
CPC ................ H01J 37/321; H01J 37/3211; H01J 37/32119; H01J 37/32128; H01J 37/32137; H01J 37/32146; H01J 37/32155; H01J 37/32165
USPC ....... 118/723 I, 723 IR, 723 AN; 156/345.48, 156/345.49; 315/111.51
See application file for complete search history.

(56) References Cited

U.S. PATENT DOCUMENTS

| | | | | |
|---|---|---|---|---|
| 5,401,350 | A | * | 3/1995 | Patrick et al. ............ 156/345.48 |
| 5,534,231 | A | | 7/1996 | Savas |
| 5,571,366 | A | * | 11/1996 | Ishii et al. ................ 156/345.26 |
| 5,777,289 | A | | 7/1998 | Hanawa et al. |
| 5,817,534 | A | | 10/1998 | Ye et al. |
| 6,043,608 | A | * | 3/2000 | Samukawa et al. ...... 315/111.51 |

(Continued)

FOREIGN PATENT DOCUMENTS

| | | |
|---|---|---|
| JP | 2001-523883 | 11/2001 |
| JP | 2003-234338 | 8/2003 |
| WO | WO 99/26267 | 5/1999 |

OTHER PUBLICATIONS

Mark J. Kushner et al.; A three-dimensional model for inductively coupled plasma etching reactors: Azimuthal symmetry, coil properties and comparison to experiments; J. Appl. Phys; Aug. 1, 1996; pp. 1337-1344; vol. 80, No. 3.

*Primary Examiner* — Luz Alejandro Mulero
(74) *Attorney, Agent, or Firm* — Baker Botts L.L.P.

(57) ABSTRACT

The invention provides a plasma processing apparatus in which ring-like conductors 8a and 8b are arranged closed to and along an induction antenna 1 composed of an inner circumference coil 1a and an outer circumference coil 1b. Ring-like conductors 8a and 8b are each characterized in that the radius from the center of the apparatus and the cross-sectional shape of the conductor body varies along the circumferential angle of the coils. Since the mutual inductances between the ring-like conductors 8a and 8b and the induction antenna 1 and between the ring-like conductors 8a and 8b and the plasma along the circumferential position are controlled, it becomes possible to compensate for the coil currents varied along the circumference of the coils of the induction antenna 1, and to improve the non-uniformity in the circumferential direction of the current in the generated plasma.

7 Claims, 15 Drawing Sheets

(56) References Cited

U.S. PATENT DOCUMENTS

| | | | |
|---|---|---|---|
| 6,401,652 B1 * | 6/2002 | Mohn et al. | 118/723 AN |
| 6,447,636 B1 * | 9/2002 | Qian et al. | 156/345.48 |
| 6,756,737 B2 | 6/2004 | Doi et al. | |
| 6,842,147 B2 * | 1/2005 | Howald et al. | 343/701 |
| 2006/0027168 A1 * | 2/2006 | Matsuda et al. | 118/723 I |

* cited by examiner

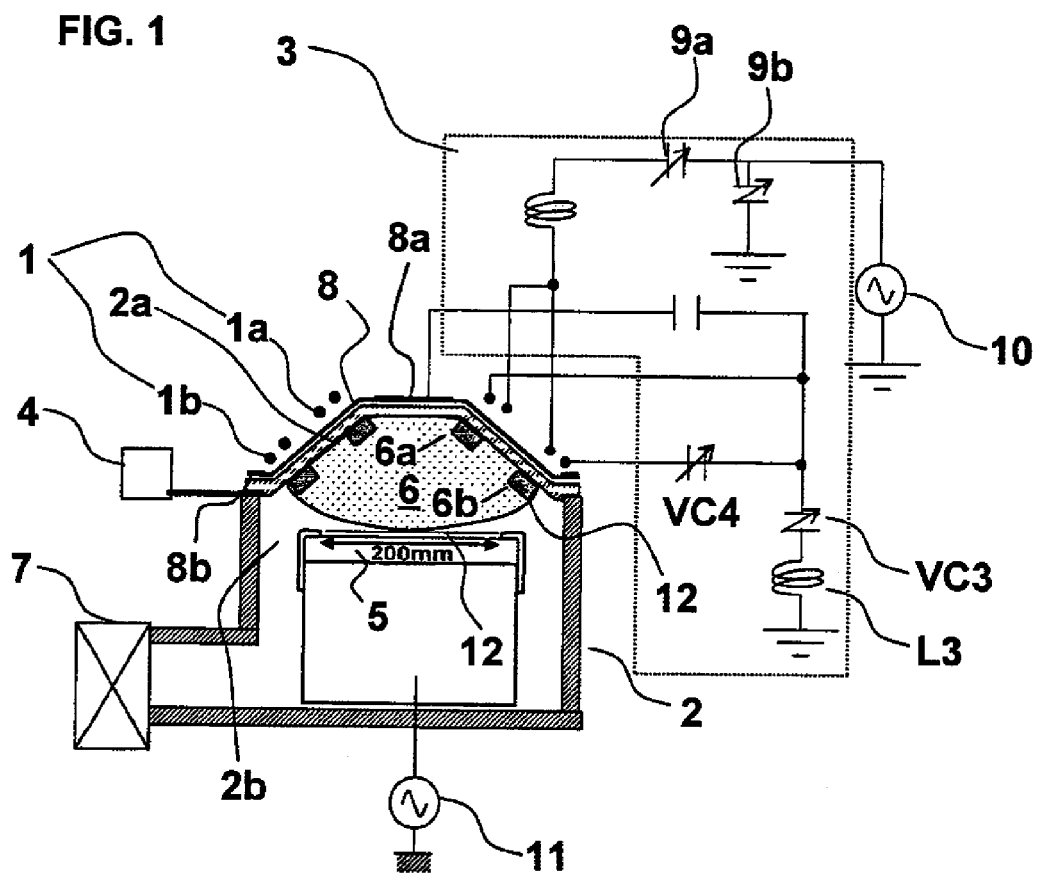

a=163mm
b=159mm
c=157mm
d=155mm

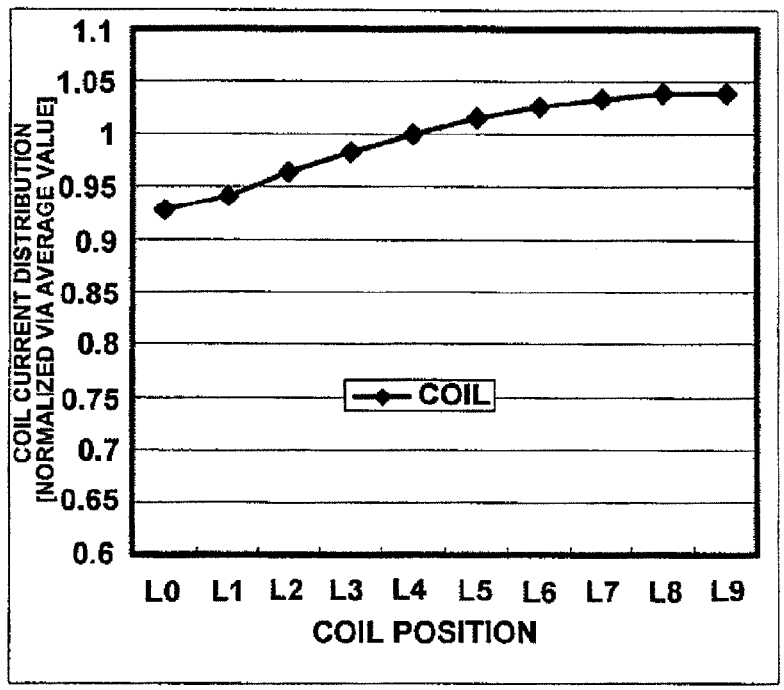
FIG. 3A (Prior Art)  COIL CURRENT DISTRIBUTION IN INNER CIRCUMFERENCE COIL 1a
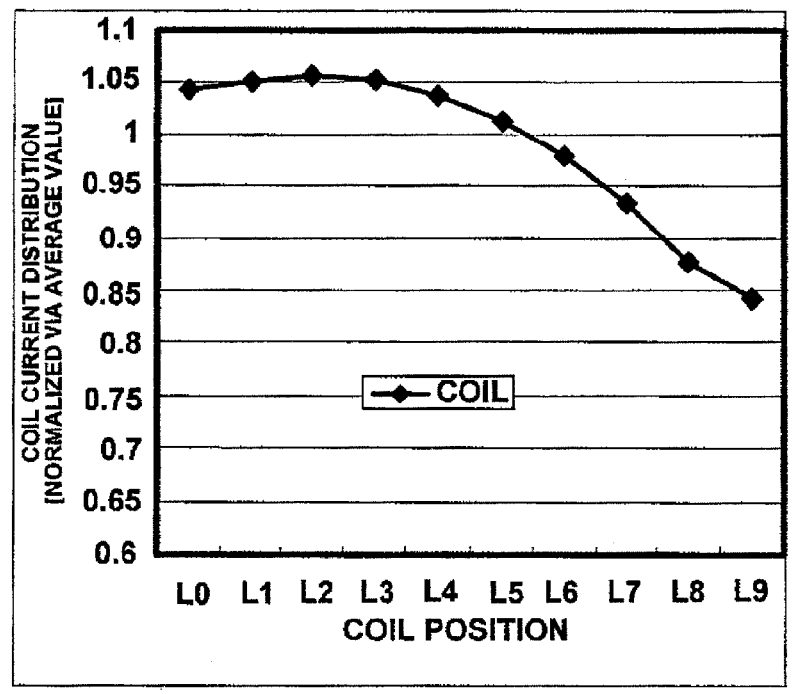
FIG. 3B (Prior Art)  COIL CURRENT DISTRIBUTION IN OUTER CIRCUMFERENCE COIL 1b PLASMA CURRENT DISTRIBUTION CORRESPONDING TO INNER CIRCUMFERENCE COIL 1a PLASMA CURRENT DISTRIBUTION CORRESPONDING TO OUTER CIRCUMFERENCE COIL 1b

FIG. 6
(Prior Art)
PLASMA DENSITY DISTRIBUTION
TAKEN AT CROSS-SECTIONS OF
$\varnothing = 0\text{-}180°$
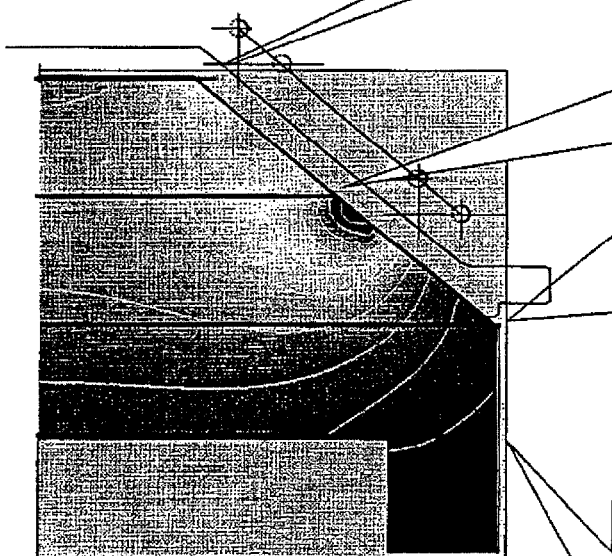
3.6947E - 002    6.4278E - 001
PLASMA DENSITY DISTRIBUTION
TAKEN AT RESPECTIVE SECTIONS
$\phi = 0°$
(POWER SUPPLY END)
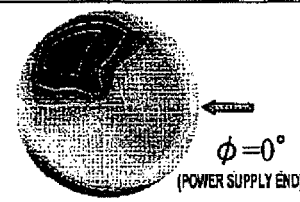
$\phi = 0°$
(POWER SUPPLY END)
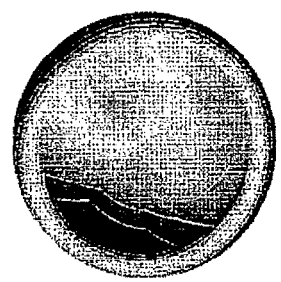
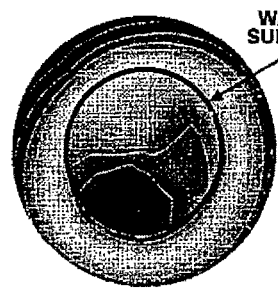
WAFER SURFACE

FIG. 7 (Prior Art)
| | | | |
|---|---|---|---|
| ACTUAL MEASUREMENT VALUE OF PLASMA DENSITY<br>Cl2=100ccm<br>VC4=100pF<br>P=0.3Pa<br>RF=1200W | Ave. | 2.8 mA/cm^2 | 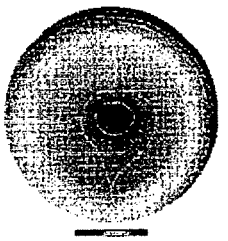 |
| | Unif | 19.1% | |
| | 90 mm ECCENTRICITY RATIO | 10.7% | |
| SiO2 ETCHING RATE<br>Cl2=100ccm<br>VC4=100pF<br>P=0.3Pa<br>RF=1200W<br>WAFER=SiO2 | Ave. | 59.77 nm/min | 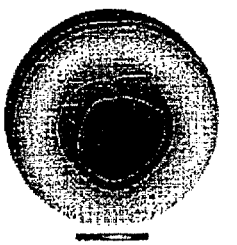 |
| | Unif | 9.4% | |
| | 90 mm ECCENTRICITY RATIO | 5.3% | |
| COMPUTED VALUE OF PLASMA DENSITY<br>3D DIFFUSION SIMULATION | Ave. | 3.4E10 m^-3 | 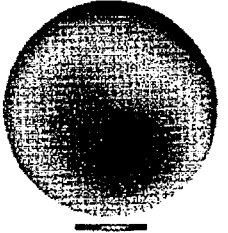 |
| | Unif | 14.6% | |
| | 90 mm ECCENTRICITY RATIO | 8.2% | |

CURRENT DISTRUBTION ON OUTER CIRCUMFERENCE COIL

PLASMA CURRENT DISTRIBUTION

CURRENT DISTRIBUTION IN COMPENSATING CONDUCTOR RING

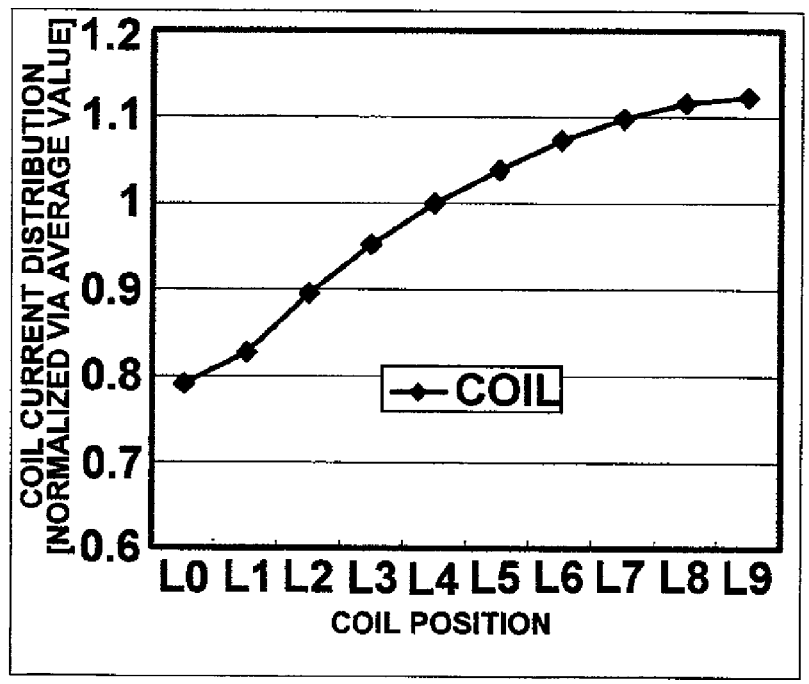
FIG. 14A  CURRENT DISTRIBUTION IN COIL 1a
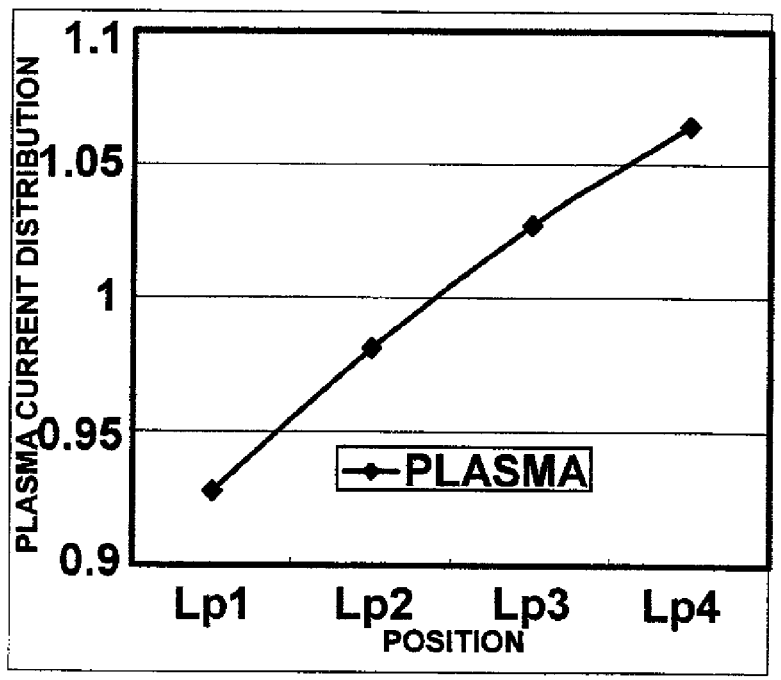
FIG. 14B  PLASMA CURRENT DISTRIBUTION

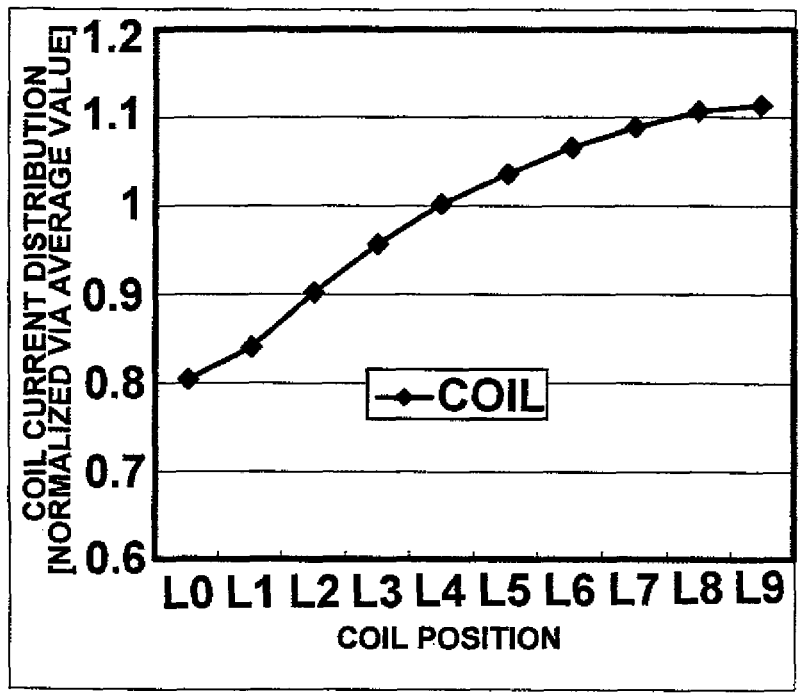
FIG. 15A CURRENT DISTRIBUTION IN COIL 1a
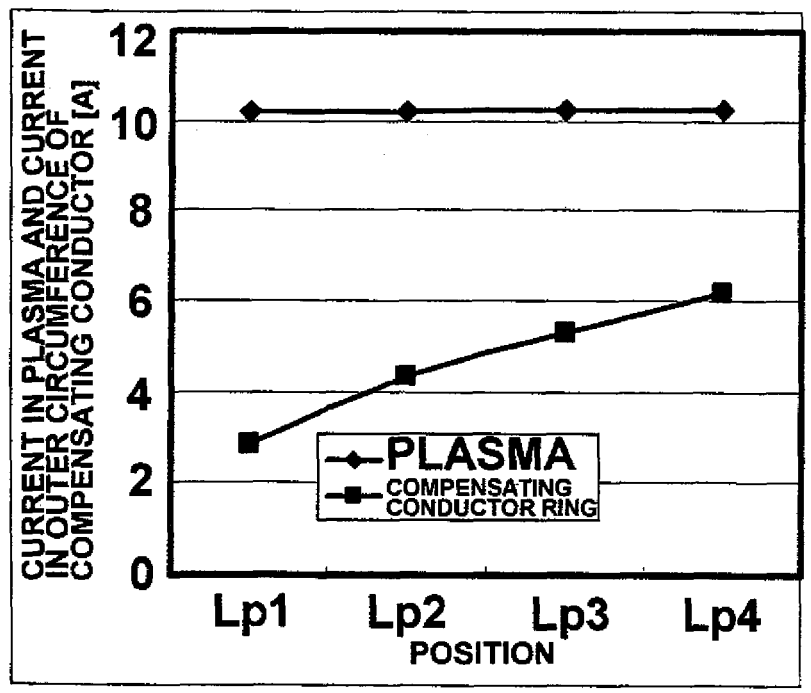
FIG. 15B DISTRIBUTION OF CURRENT IN PLASMA AND IN OUTER CIRCUMFERENCE OF COMPENSATING CONDUCTOR RING 8a

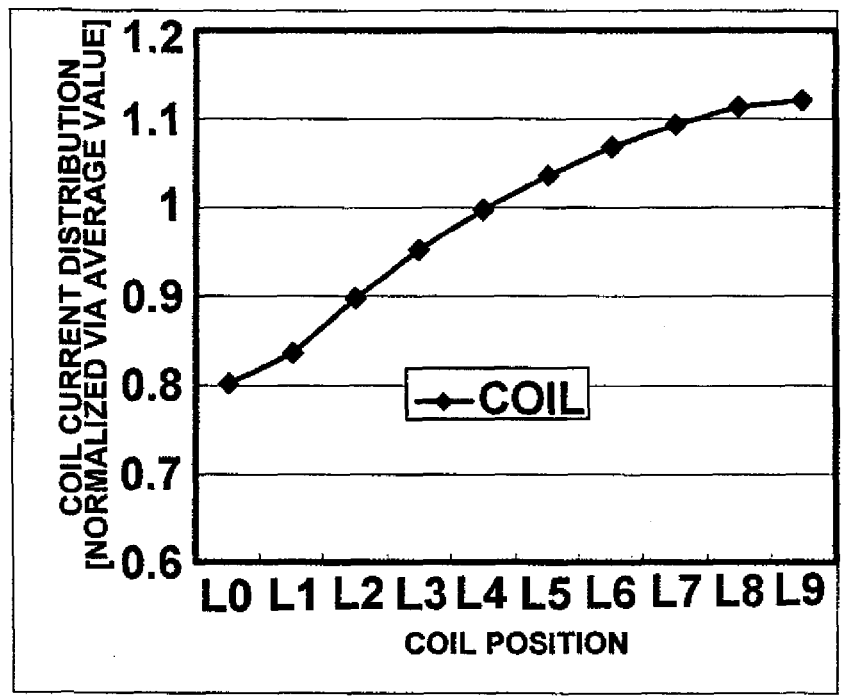
FIG. 16A CURRENT DISTRIBUTION IN COIL 1a
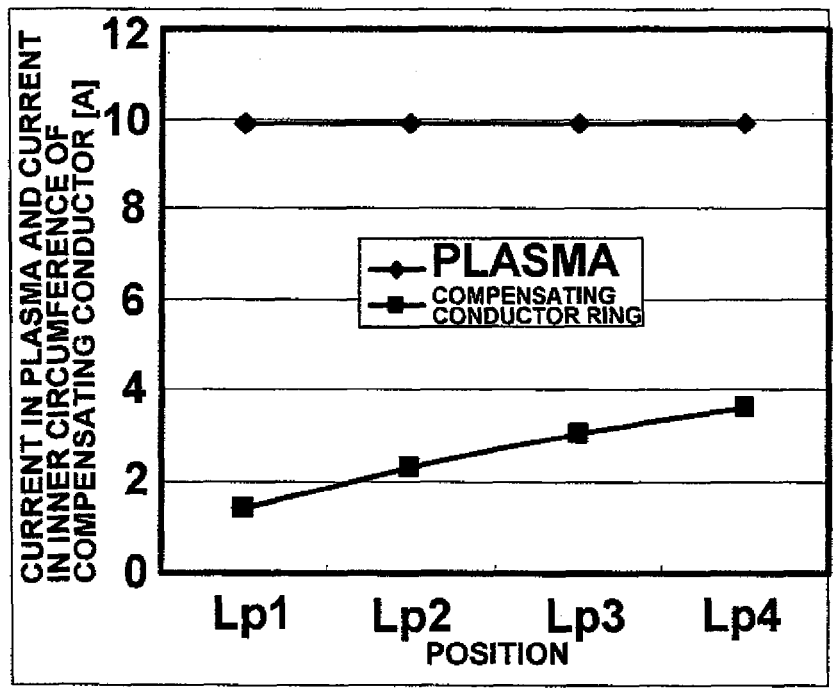
FIG. 16B DISTRIBUTION OF CURRENT IN PLASMA AND IN INNER CIRCUMFERENCE OF COMPENSATING CONDUCTOR RING 8b

PLASMA PROCESSING APPARATUS

The present application is based on and claims priority of Japanese patent application No. 2009-257312 filed on Nov. 10, 2009, the entire contents of which are hereby incorporated by reference.

BACKGROUND OF THE INVENTION

1. Field of the Invention

The present invention relates to a plasma processing apparatus using plasma for performing surface processing such as etching a substrate or forming thin films on a substrate.

2. Description of the Related Art

In the field of manufacturing semiconductor devices, inductively-coupled plasma processing apparatuses are adopted as etching and CVD apparatuses. In inductively coupled plasma processing apparatuses, an induction coil formed of a few turns is disposed on the outer side of a vacuum chamber and high frequency current is supplied to the induction coil, to thereby feed power to the plasma generated in the vacuum chamber and maintain the generated plasma. In order to supply sufficient current through the induction coil, a high voltage up to a few KV is generated along the coil, and a large stray capacitance exists between the induction coil and the plasma.

The high voltage and stray capacitance cause the following two problems. One problem is that the high voltage on the coil is electrostatically coupled with the plasma via the stray capacitance existing between the induction coil and the plasma, causing local damage of the dielectric window existing between the coil and the plasma. The other problem is that while the current circulates through the coil, the stray capacitance existing in the path causes the coil current to change along the path deteriorating the uniformity of the generated plasma in the circumferential direction.

The former problem can be solved by disposing a Faraday shield between the induction coil and the plasma, as disclosed in patent document 1 (specification and drawings of U.S. Pat. No. 5,534,231) and patent document 2 (specification and drawings of U.S. Pat. No. 6,756,737).

The latter problem can be solved as disclosed for example in non-patent document 1 (Mark J. Kushner et al., "A three-dimensional model for inductively coupled plasma etching reactors: Azimuthal symmetry, coil properties, and comparison to experiments" J. Appl. Phys. 80 (3), 1 Aug. 1996, p. 1337-1344) disclosing a method for suppressing the non-uniformity of the circulating coil current by disposing a coupling capacitor on the terminal end of the induction coil. However, the method introducing the coupling capacitor disclosed above had the following problems. One problem is that the coupling capacitor has an effect to suppressing the non-uniformity of the circulating current along the circumference, but cannot make perfectly the current uniform. The quantitative description thereof will be provided later. The second problem is that the optimum value of the capacitor must be varied according to operation conditions (operation plasma density, pressure, used gas conditions, etc.), but it is impossible to replace the capacitor corresponding to such various conditions in mass production apparatuses. The attempt to adopt a variable capacitor as the capacitor causes increase of cost of the control unit and complication of operation methods. The third problem is that the coupling capacitor must have a property to endure a few tens of KVA, according to which the geometrical shape of the capacitor is increased, and the attempt to mount the capacitor in a matching box disposed on the upper portion of the apparatus causes the matching box size to increase, leading to problems related to mounting design.

The second and third problems are especially significant in apparatuses having an induction coil group divided into two systems, an inner circumference coil and an outer circumference coil, and enabling the coil current ratio of the inner and outer coils, to be varied so as to control the radial uniformity of the plasma according to operation conditions (refer to patent document 2 and patent document 3 (specification and drawings of U.S. Pat. No. 5,777,289), for example) and in apparatuses capable of having the voltage applied to the Faraday shield controlled to adjust the degree of capacitive coupling with the plasma and to thereby stabilize the inner wall status within the vacuum chamber (refer to patent document 2 and patent document 4 (specification and drawings of U.S. Pat. No. 5,817,534), for example).

SUMMARY OF THE INVENTION

When non-uniformity of the coil current along the circumference occurs, it is necessary to take measures to eliminate such non-uniformity so as not to deteriorate the uniformity of the generated plasma along the circumferential direction. Therefore, even if non-uniformity of coil current occurs, it is desirable to compensate for such non-uniform current so as to ensure the uniformity of the generated plasma along the circumferential direction.

The object of the present invention is to provide a plasma processing apparatus capable of compensating for the coil current varied along the circumference of the coil, and to improve the uniformity of the generated plasma along the circumferential direction.

In general, the local density of plasma is determined by the local plasma current generated via induction coupling. The induced plasma current itself is determined by the current along the coil as well as the distribution of the mutual inductance between the coil and the plasma. When a ring-shaped passive conductor is disposed near the coil, a mutual inductance between the ring conductor and the plasma and a mutual inductance between the ring conductor and the coil is generated in addition to the original mutual inductance between the coil and the plasma, which influence the distribution of the plasma current. When circumferential non-uniformity of the coil current exists, the mutual inductances should desirably be varied at various angles corresponding to the circumference so as to compensate for the non-uniformity. The present invention discloses the actual methods thereof and the result of confirmation of the effects thereof.

In order to achieve the above object, the present invention provides a plasma processing apparatus comprising a vacuum processing chamber for generating plasma in the interior thereof, a means for introducing gas into the vacuum processing chamber, a stage for placing a sample disposed in the vacuum processing chamber, an insulating dielectric window constituting an upper area of the vacuum processing chamber and covering a plasma generating space above the stage, a coil-like induction antenna disposed on an outer side of the dielectric window for generating plasma within the plasma generating space in the vacuum processing chamber, a high frequency power supply and a matching box for supplying current to the induction antenna, and a conductor disposed near the induction antenna and arranged along the induction antenna for controlling the local mutual inductances between the conductor and the antenna and between the conductor and the plasma along the circumferential position.

In the present plasma processing apparatus, the conductor disposed along the induction antenna is a ring-like conductor substantially concentric with the induction antenna, and the mutual inductances between the ring-like conductor and the induction antenna and between the ring-like conductor and the plasma are gradually varied according to the circumferential position of the ring-like conductor.

According to the above-mentioned plasma processing apparatus in which the conductor is a ring-like conductor, a Faraday shield is disposed between the dielectric window and the induction coil (induction antenna), capable of having the voltage thereof controlled via the matching box. Further, the ring-like conductor is electrically in contact with the Faraday shield, wherein the conductor is disposed on an outermost circumference of a plurality of the induction coils (induction antennas), and the radius of the inner circumference of the ring is gradually varied according to the circumference of the ring, or in another example, the ring-like conductor is electrically in contact with the Faraday shield, wherein the conductor is disposed on an innermost circumference of a plurality of the induction coils, and the radius of the outer circumference of the ring is gradually varied according to the circumference of the ring.

In other words, a ring-like conductor is disposed near the induction coil, and the ring-like conductor can have its radius from the center of the apparatus or the cross-sectional shape thereof varied corresponding to the circumference angles of the coil.

According to the present plasma processing apparatus, the dielectric window can be designed to have a flat plate shape. The plasma processing apparatus can be formed by arranging the plate-shaped induction coil on a plate-shaped dielectric window.

The plasma processing apparatus of the present invention includes a conductor disposed near the induction antenna and arranged along the induction antenna, and the mutual inductances at circumferential positions between the conductor and induction antenna and between the conductor and plasma are controlled, so that it becomes possible to compensate for the coil current non-uniformity along the circumference of the coil, and to improve the uniformity of the generated plasma in the circumferential direction.

BRIEF DESCRIPTION OF THE DRAWINGS

FIG. 1 is a cross-sectional view of a plasma processing apparatus according to the present invention;

FIG. 3A is a view showing the current distribution in an induction coil according to the prior art;

FIG. 3B is a view showing the current distribution in an induction coil according to the prior art;

FIG. 6 is a simulation results on plasma diffusion within a vacuum chamber according to the prior art;

FIG. 7 is a view showing the result of experimental measurement of the plasma density above a wafer, the result of measurement of the SiO2 etching rate, and the result of simulation of the plasma density above the wafer according to the prior art;

FIG. 14A is a view showing the coil current distribution according to the second embodiment, wherein the ring-like conductor according to the present invention is not used;

FIG. 14B is a view showing the plasma current distribution according to the second embodiment, wherein the ring-like conductor according to the present invention is not used;

FIG. 15A is a view showing the coil current distribution according to the second embodiment, wherein the ring-like conductor 8*a* according to the present invention is used;

FIG. 15B is a view showing the plasma current distribution according to the second embodiment, wherein the ring-like conductor 8*a* according to the present invention is used;

FIG. 16A is a view showing the coil current distribution according to the second embodiment, wherein the ring-like conductor 8*b* according to the present invention is used; and FIG. 16B is a view showing the plasma current distribution according to the second embodiment, wherein the ring-like conductor 8*b* according to the present invention is used.

DETAILED DESCRIPTION OF THE PREFERRED EMBODIMENTS

Figure 2A:
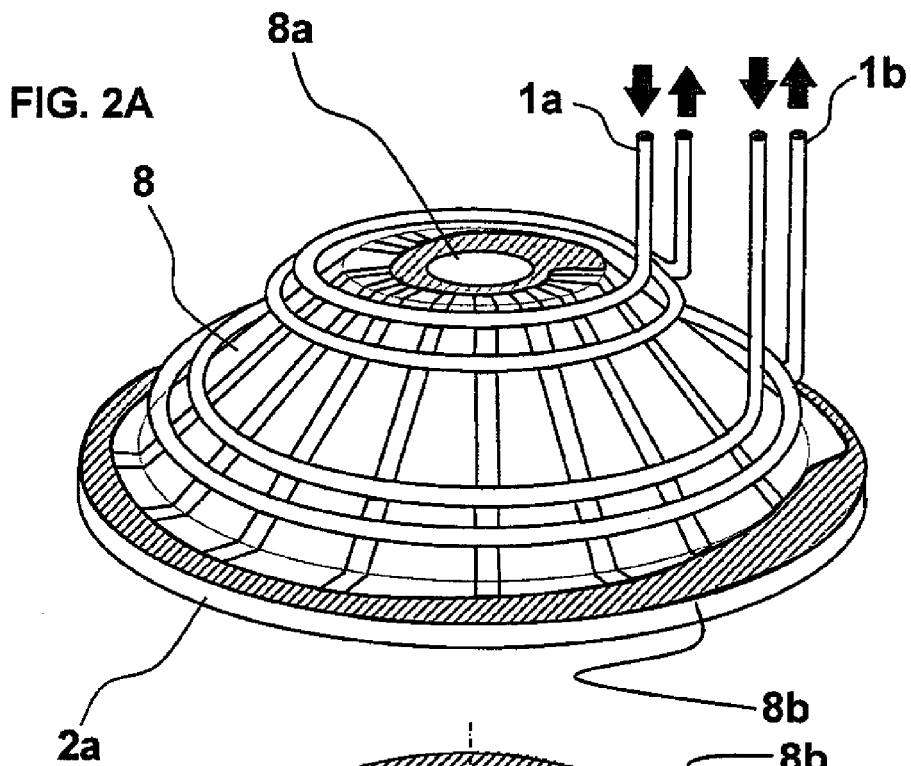
FIG. 2A is a bird eye view showing a first embodiment of the present invention.

Now, the preferred embodiments of the plasma processing apparatus will be described with reference to the drawings.

A first preferred embodiment takes the inductively coupled etching apparatus disclosed in patent document 2 as an example, and the means to compensate non-uniform circulating coil current will now be described, taking the inductively coupled etching apparatus as an example.

FIG. 1 is a cross-sectional view of a plasma processing apparatus according to the present invention. A vacuum chamber 2 includes a discharge window 2*a* composed of an insulating material forming a plasma generation portion (such as a nonconductive material like Al$_2$O$_3$ ceramics), and a processing unit 2*b* having an electrode 5 for placing a sample 12 which is the object to be processed. On the outer side of the discharge window 2*a* is disposed an inductively coupled antenna 1 having the form of a coil. The inductively coupled antenna 1 is respectively separated into two coil systems, a two-turn inner circumference coil 1a and a two-turn outer circumference coil 1b, wherein the conduction current of each line can be controlled via the control of a variable capacitor VC4 within a matching box 3 described later. Further, a Faraday shield 8 having a circular truncated cone shape coupled capacitively with the plasma 6 is disposed on the outer side of the discharge window 2a. The inductively coupled antenna 1 and the Faraday shield 8 are connected in series to a first high frequency power supply 10 via a matching box 3. Further, a circuit having a variable impedance components (VC3, L3) is connected to the ground in parallel with the Faraday shield 8, so as to control the applied voltage to the Faraday shield 8.

While having processing gas supplied from a gas supply device 4 into the vacuum chamber 2, the reactor is evacuated and controlled to a predetermined pressure via an evacuation device 7. Processing gas is supplied via a gas supply device 4 into the vacuum chamber 2, and the processing gas is turned into plasma by the function of the electric field generated by the inductively coupled antenna 1 and the Faraday shield 8. A second high frequency power supply 11 is connected to an electrode 5. Further, the RF electric field for generating plasma is obtained by supplying a high frequency power, such as 13.56 MHz, 27.12 MHz and 2 MHz, generated by the first high frequency power supply 10 to the inductively coupled antenna 1 and the Faraday shield 8, and in order to suppress power reflection, a matching box 3 is used to match the impedance of the inductively coupled antenna 1 to the output impedance of the first high frequency power supply 10. The matching box 3 utilizes a so-called inversed-L arrangement of variable capacitor 9a and 9b capable of varying the capacitance. Further, in order to extract ions from the plasma 6 toward the sample 12, a bias voltage is applied to the electrode 5 from the second high frequency power supply 11.

The Faraday shield 8 is composed of a metal conductor having vertically-striped slits, arranged to be superposed with the vacuum chamber 2 made of ceramics. The voltage to the Faraday shield 8 is controlled via a variable capacitor denoted as VC3 of FIG. 1. The Faraday shield 8 has a function to prevent local damage of the ceramic discharge window 2a due to the local capacitive coupling to the plasma caused by the local high voltage of the inner and outer circumference coils 1a and 1b, and a function to maintain the inner wall at an optimum state by providing an actively controlled and uniform capacitive coupling.

Ring-like conductors 8a and 8b having a unique shape is mounted to the illustrated positions in FIG. 1. Namely, the ring-like conductor 8a compensates the circumferential non-uniformity occurring in the coil current flowing through the inner induction coil 1a which is disposed on the inner side of the induction coil 1a at the upper surface of the circular cone-shaped Faraday shield 8. The ring-shaped conductor 8b compensates for the circumferential non-uniformity occurring in the coil current flowing through the outer circumference induction coil 1b, which is disposed on the outer side of the induction coil 1b at the skirt portion of the circular cone.

Figure 2B:
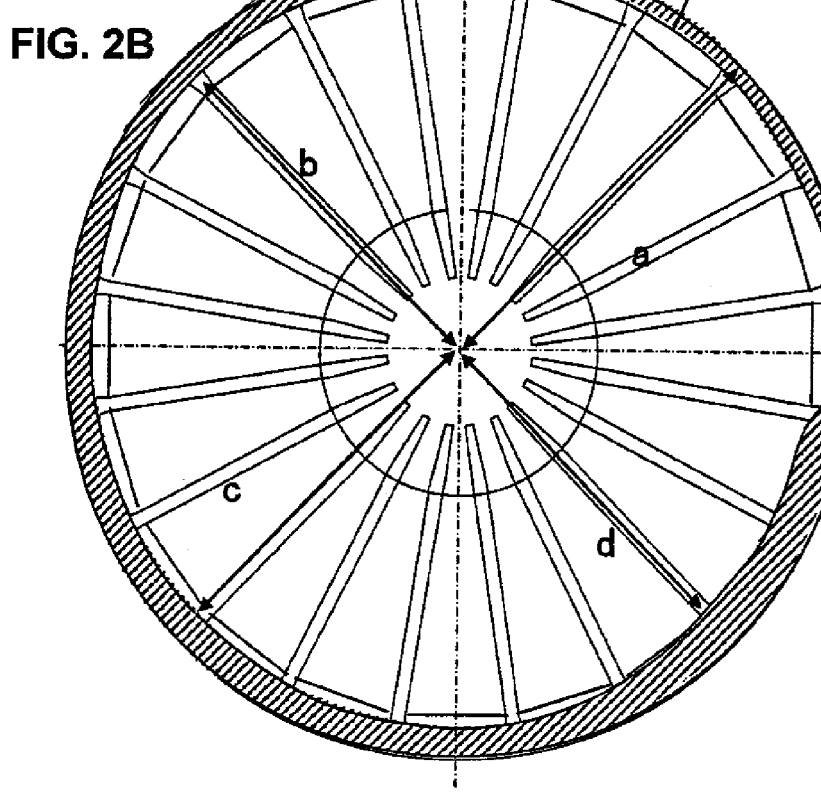
FIG. 2B is a plane view showing the first embodiment of the present invention.

One example of the ring shapes of the ring-like conductors 8a and 8b is illustrated in FIG. 2. FIG. 2A illustrates a bird eye view of first embodiment of the ring-like conductors adopted in the plasma processing apparatus illustrated in FIG. 1, and FIG. 2B is a plane view showing the outer ring-like conductor 2a of the two ring-like conductors illustrated in FIG. 2A. The mechanism of the ring will be described later, but when no coupling capacitor is inserted to the terminal end of the coil, in general, there is a tendency that the coil current is weak at the power supply end (inlet side) connected to the power source, and gradually increased toward the terminal end (outlet side). In the example shown in FIG. 1, the inner coil 1a corresponds to this type of coil. Therefore, the ring-like conductor 8a for compensating for the inner coil is designed so that it has a uniform thickness, but has a smaller radius near the inlet port of the inner circumference coil 1a, and, the ring-like conductor 8a towards the outlet port of the inner circumference coil 1a by increasing the outer radius but with the same inner radius. According to such arrangement, at the circumferential position where the outer radius of the ring-like conductor 8a is small (power supply end), the mutual inductance between the ring-like conductor 8a and plasma/inner circumference coil 1a becomes small, and the induced plasma current is increased. In contrast, at the circumferential position where the radial width of the ring-like conductor 8a is large (terminal end), the mutual inductance between the plasma/coil 1a and the ring-like conductor 8a becomes large, according to which the current is taken into the ring-like conductor 8a, and as a result, the plasma current tends to be reduced. Therefore, the arrangement enables to compensate for the existing non-uniformity of plasma current caused by the circulation of coil currents.

On the other hand, the outer ring-like conductor 8b is designed to have a uniform thickness, but with a larger radial width near the inlet port of the outer coil 1b by reducing the inner radius of the conductor with the same outer radius, and in contrast, the radial width is narrowed near the outlet of the outer coil 1b by increasing the outer radius of the conductor without varying the outer radius of the conductor. According to this arrangement, the mutual inductance between the ring-like conductor 8b and plasma/the coil 1b becomes greater at the circumferential position where the radial width of the ring-like conductor 8b is large (power supply end), according to which the current is taken into the ring-like conductor 8b, and as a result, the induced plasma current tends to be reduced. In contrast, at the circumference position having a small radial width of the ring-like conductor 8b (terminal end), the mutual inductance between the plasma and coil 1b and the ring-like conductor 8b becomes small, and the plasma current tends to be increased. Therefore, it becomes possible to compensate for the existing non-uniformity of the plasma current accompanying the circulation of the coil current.

Now, the ring-like conductor used in the plasma processing apparatus according to the present invention will further be described quantitatively, and the result of the simulation and the result of experiments testing the validity of the present function will be described.

At first, the non-uniformity of the coil current, the non-uniformity of the plasma current caused thereby, and the non-uniformity of the etching results according to the prior art will be described using simulation and experimental data. Here, the prior art is defined as a case where conductive rings 8a and 8b are not provided or rings having fixed inner and outer diameters in the circumferential direction are provided to the illustrated device of FIGS. 1 and 2.

FIG. 3 shows a coil current obtained along a coil. FIG. 3A shows the current related to the inner circumference coil 1a, and FIG. 3B shows the current related to the outer circumference coil 1b. The vertical axes of the drawings represent a coil current normalized via an average value of the coil current. Regarding L0 and L1 through L9 of the horizontal axes, L0 and L9 represent the vertical shaft portions (terminal ends) of the power feed line (power feed end) and the return line of the respective coils. L1 and L2 through L8 represent respective 90-degree arcs when the coil is divided into eight areas (90 degrees each, corresponding to two turns), in the order from the power supply side. Further, these coil currents are computed using an equivalent circuit shown in FIG. 4 described later. As for the conditions of computation, a condition was selected wherein the series impedance of VC3+L3 illustrated in FIG. 2 becomes zero. Namely, the condition corresponding to the operation condition in which the Faraday shield 8 is grounded. In addition, the VC4 for controlling the current ratio flowing through the coils 1a and 1b is 100 pF. This corresponds to [current of inner circumference coil 1a]/[current of outer circumference coil 1b]=½.

Based on FIG. 3 showing the computed results, it is recognized that the coil current of the inner circumference coil 1a increases along with the circulation, but on the other hand, the coil current of the outer circumference coil 1b is reduced along with the circulation. According to the example of the present embodiment, the inner circumference coil 1a does not have a capacitors on the power feed end and the terminal end, and the outer circumference coil 1b has a variable capacitor VC4 disposed on the terminal end so as to control the inner circumference/outer circumference coil current ratio and to ensure radial uniformity. Therefore, the increasing/decreasing tendency of the coil current is opposite in FIG. 3A and FIG. 3B. The cause of this phenomenon will be described below.

Figure 4:
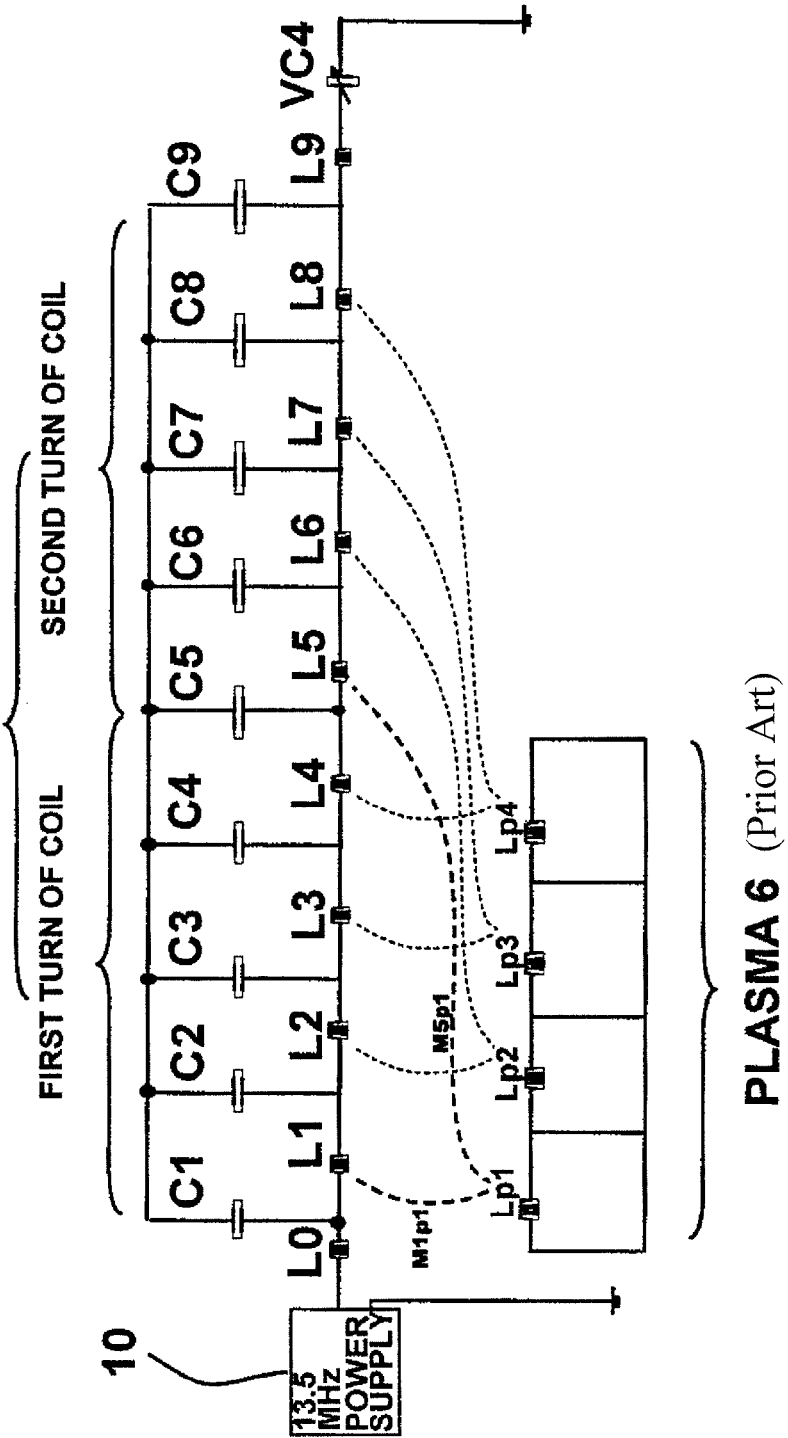
FIG. 4 is an equivalent circuit modeling the induction coil and the plasma circuit according to the prior art.
Figure 5A:
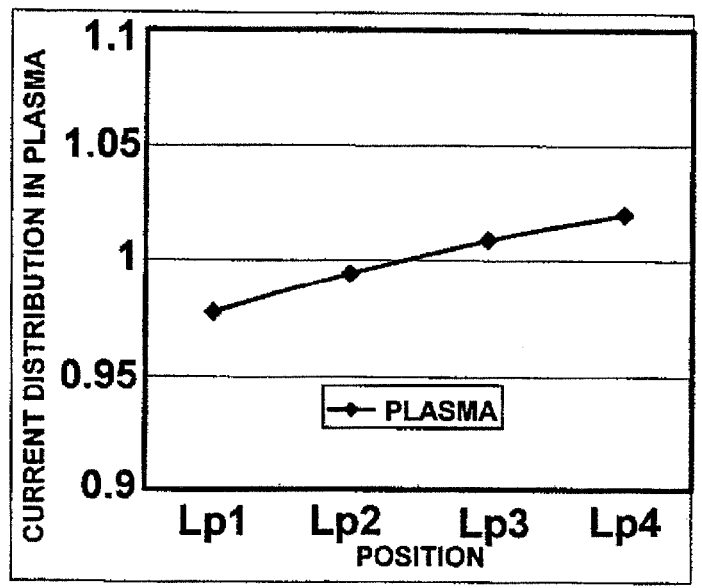
FIG. 5A is a view showing the plasma current distribution according to the prior art.
Figure 5B:
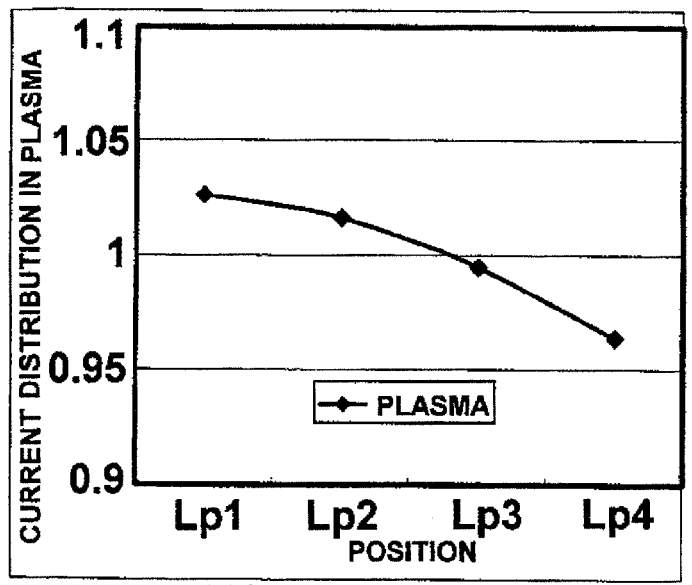
FIG. 5B is a view showing the plasma current distribution according to the prior art.

The equivalent circuit between the coils 1a and 1b and the plasma and the Faraday shield 8 can be expressed as shown in FIG. 4. Now, FIG. 4 corresponds to the outer circumference coil 1b (or the inner circumference coil 1a). In the case of the inner circumference coil 1a, VC4 equals ∞ (short circuit), and in the case of the outer circumference coil 1b, VC4 equals 100 pF. L0 and L9 represent the inductance of the vertical shaft portions of the power supply line and the return line of the coil, and L1 through L8 represent the self inductance of the respective 90-degree circular arcs when the coil is divided into eight segments (90 degrees each, corresponding to two turns). Further, C1 through C9 represent the stray capacitances between the coils 1a and 1b and the Faraday shield 8. Further, as for the stray capacitances, even in the case of an apparatus having no Faraday shield 8, stray capacitances between the coils 1a and 1b and the plasma exist, so that the following descriptions apply substantially in the same manner. Lp1 and Lp2 represent the self inductances of the induction current ring flowing through the plasma, which are respectively divided into ¼ turns. The two turns of coils and the single turn of plasma current are inductively coupled, and for example, the Lp1 of the plasma and the L1 and L5 of the coil are coupled through mutual inductances M1$p$1 and M5$p$1.

Further, the expressions of the self inductance L, the mutual inductance M and the stray capacitance C used for circuit computation are as follows:

$$L = \mu_0 R_a (\text{Log}(8R_a/a) - 2)$$

$$M = \mu_0 (R_a R_b)^{0.5} * [(2/k - k)K(k) - 2/kE(k)]$$

$$k = [4R_a R_b / ((R_a + R_b)^2 + d^2)]^{0.5}$$

$$d = ((R_a - R_b)^2 + (Z_a - Z_b)^2)^{0.5}$$

$$C = 2\pi \in_0 \in L / \ln(2h/a)$$

wherein
$\mu_0$: vacuum permeability;
$R_{a/b}$: main radius of coil a/b;
a: small radius of coil;
$Z_{a/b}$: height position of coil a/b;
K (k), E (k): complete elliptic integral of the first and second kinds;
$\in_0$: vacuum permittivity
$\in$: relative permittivity;
L: coil circumference length;
h: distance between coil and Faraday shield or distance between coil and plasma (without Faraday shield).

The actual dimensions used in the apparatus are: a=3.2 mm, Ra/b=71 mm, 86 mm, Za/b=80 mm, 68 mm as for the inner circumference coil 1a; Ra/b=137 mm, 153 mm, Za/b=27 mm, 15 mm as for the outer circumference coil 1b; and a=20 mm, Ra=60 mm (FIG. 2-6a) and 125 mm (FIG. 2-6b) Za=55 mm (FIG. 2-6a), and 0 mm (FIG. 2-6b) as for the plasma. Further, h=12.5 mm, L=2πRa and $\in$=1.

The coils 1a and 1b and the Faraday shield 8 constitute a transmission line of series L and parallel C, and in general, it is known that when the terminal end is a short circuit, the current increases towards the terminal end, and when the terminal end is opened (or a capacitor ended), the current reduces toward the terminal end (Refer for example to non-patent document 1). FIGS. 3A and 3B correspond to this principle. The distribution of the coil current shown in FIG. 3 is obtained by completing the circuit shown in FIG. 4 with respect to the coil current.

FIG. 5 shows the circumferential distribution of plasma current obtained using the circuit illustrated in FIG. 4 when the above-mentioned non-uniformity occurs to the coil current. non-uniformity occurs to the plasma current in correspondense to the non-uniformity of the coil current, and it can be seen that a circumferential non-uniformity of approximately 5% in range occurs.

Plasma is generated directly close to the coil within the vacuum chamber 2, diffused within the reactor 2 and reaches the surface of the electrode 5. The non-uniformity of plasma generation distribution is somewhat moderated in the process of plasma diffusion towards the electrode, but non-uniformity of plasma density in the circumferential direction remains on the surface of the sample. FIG. 6 illustrates the computed plasma diffusion, wherein solving a diffusion equation ∇·D∇N=S regarding plasma density N is obtained via a 3D finite element method within the vacuum chamber 2. In the equation, S represents the generation distribution of plasma, and assuming that the generation distribution is proportional to the square of the plasma current shown in FIG. 5, it is provided to the area directly below the coil (areas 6a, 6b . . . in FIG. 1). A state is illustrated where the plasma is diffused toward the downstream direction from the generation portion and reaches the sample surface, and as a result, the non-uniformity of plasma density on the sample surface becomes 5% in the example, and affects the non-uniformity of the etching rate. In the example of FIG. 6, computation is performed under an operation condition where the average current of the inner circumference coil 1a is set to the square of the average current of the outer circumference coil 1b, and in this case, the plasma density distribution above the wafer presents a distribution mainly reflecting the circumferential non-uniformity of the outer circumference coil 1b, so that according to the distribution, the density is higher in the left half and is smaller in the right half than the power supply end.

FIG. 7 illustrates the result of actual measurement of the plasma density by setting a multi-probe on the sample surface, and the result of etching an $SiO_2$ thin film as material to be etched using $Cl_2/BCl_3$ gas, together with the computation result shown in FIG. 6. It can be seen that the direction of non-uniformity of the three examples is substantially the same, and that the non-uniformity of the above-mentioned lower coil current affects the etching performance.

Figure 8:
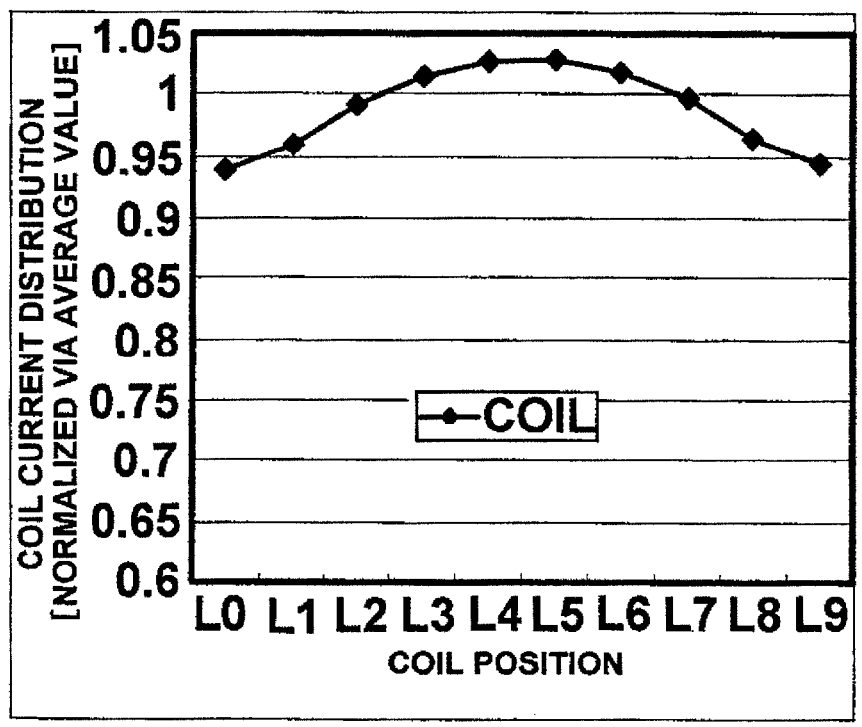
FIG. 8 is a view showing the distribution of coil current when an optimum coupling capacitor is inserted to a terminal of an induction coil according to the prior art.

Further, an example in which the system according to the present apparatus adopts an optimum capacitor inserted to the terminal end of the prior art system as shown in the cited example will be described. In the case of the present embodiment, the input inductance seen from the power supply end of the outer circumference coil is L=1.1 µH, so that the value of the optimum insert capacitor is C=2/ω²/L=200 pF. (ω is angular frequency, wherein 2π*13.56 MHz). The coil current in this case has the same current value for the input end and the terminal end, as shown in FIG. 8, and the non-uniformity along the coil is moderated to a certain level, but since the current becomes maximum at the intermediate area of the coil, the non-uniformity cannot be controlled completely. According to the present embodiment in which two turns of induction coil constitute a single set, the plasma current is uniformized to a certain level by the averaging effect corresponding to two turns of coil, but along with the increase in diameter of the apparatus, for example, the coil arrangement may adopt a plurality of single-turn coils connected in parallel, so that the maximum value at the center of the coils will still remain by adopting a terminal end capacitor.

Next, an example of adopting a ring-like conductor having a variable shape in the plasma processing apparatus according to the present invention will now be described. In this case, according to FIG. 2 of the present embodiment, the coil having a strong effect on the plasma density non-uniformity above the wafer is the outer circumference coil, so the description is mainly related to the behavior of the outer circumference coil.

Figure 9A:
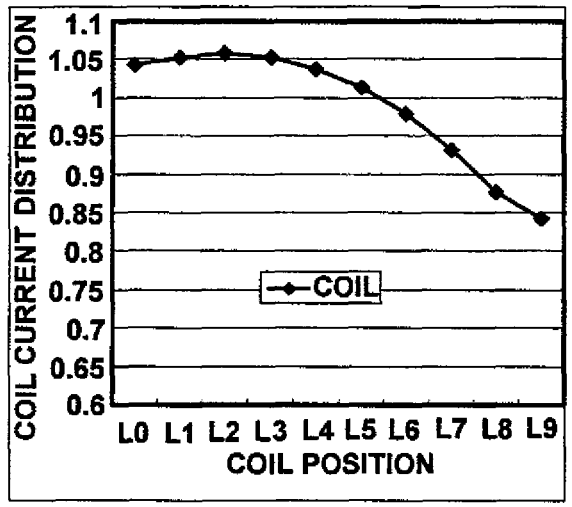
FIG. 9A is a view showing the distribution of coil current when a ring-like conductor according to the present invention is disposed.
Figure 9B:
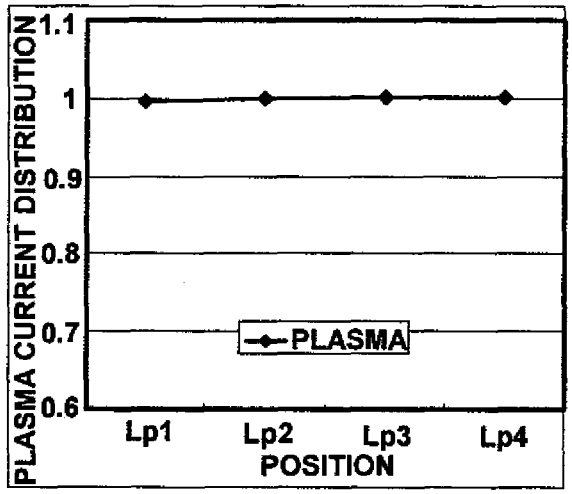
FIG. 9B is a view showing the distribution of plasma current when the ring-like conductor according to the present invention is disposed.
Figure 9C:
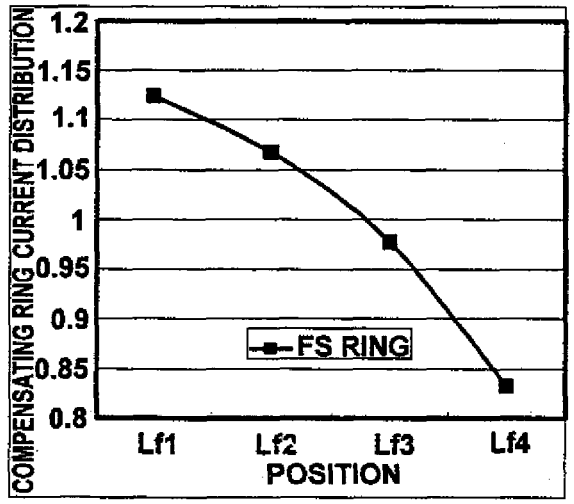
FIG. 9C is a view showing the distribution of current in the conductor ring when the ring-like conductor according to the present invention is disposed.

FIG. 9 illustrates the circumferential distribution of coil current, ring current and plasma current when a ring-like conductor 8b is adopted. Compared to FIGS. 3B and 5B having no ring-like conductor, the non-uniformity of the coil current itself is unchanged, but as shown in FIG. 2, since the inner radius of the ring-like conductor is varied to correspond to the circumferential positions, so as a result, the mutual inductance between the plasma, coil and ring-like conductor is varied, and the induction magnetic field sensed by the plasma becomes uniform as a result, and as shown in FIG. 9B, the distribution of plasma current becomes uniform. Further, as shown in FIG. 9C, corresponding to the plasma current, the current flowing through the ring-like conductor is distributed in the circumferential direction to compensate for the non-uniformity of the coil current. The excessive current (or under current) corresponding to the portion where the current circulating the ring-like conductor is not constant is flown through a bar portion of the Faraday shield to satisfy the overall current conservation but the current flown through the bar portion does not affect the induction current of plasma.

Figure 10:
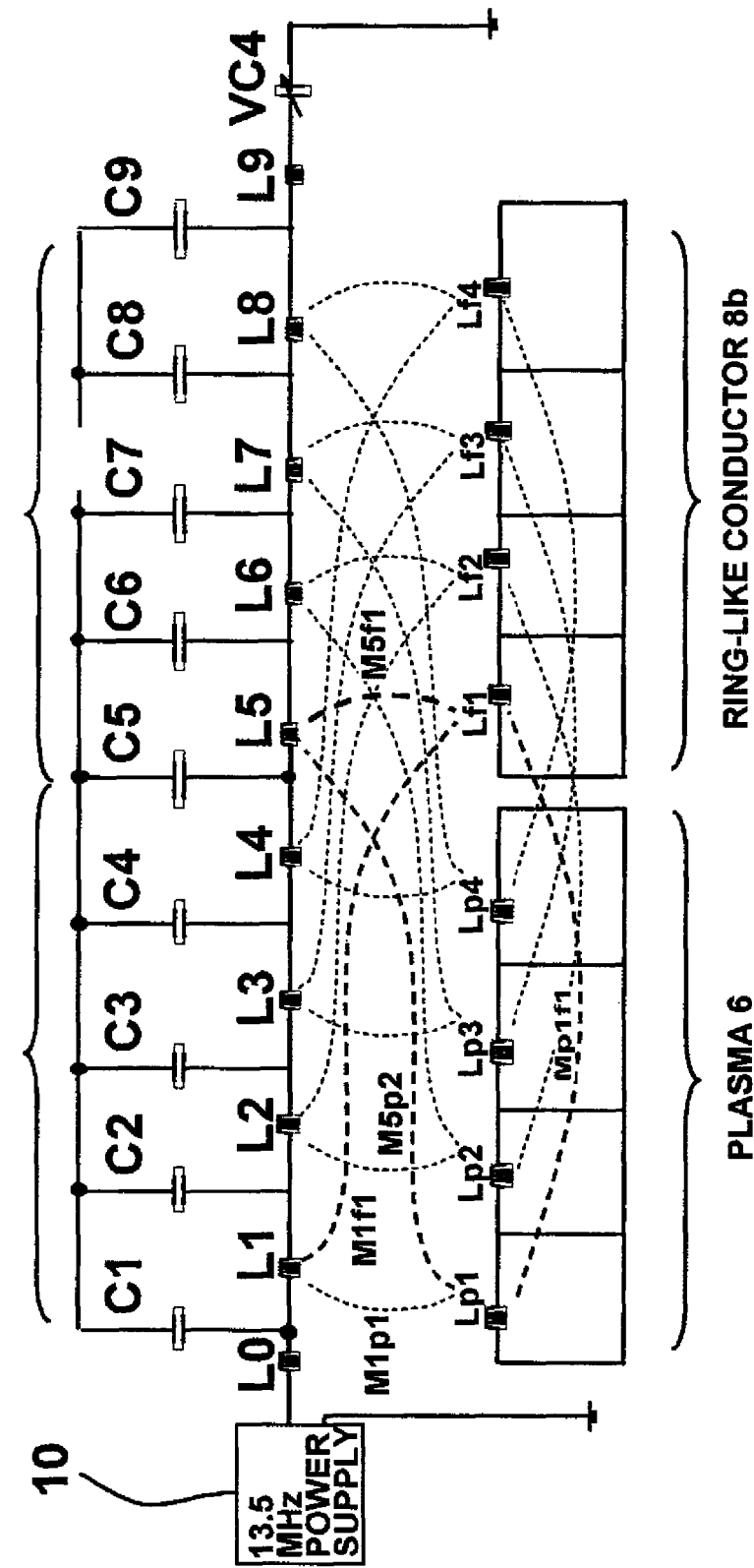
FIG. 10 is an equivalent circuit modeling the ring-like conductor, the induction coil and the plasma circuit according to the present invention.

These results were obtained from the equivalent circuit model having introduced the ring-like conductor illustrated in FIG. 10. In the drawing, ring-like conductor circuit denoted by Lf1 through Lf4 is added to the equivalent circuit of FIG. 4, and since the ring-like conductor is disposed, mutual inductances between the plasma and coil, such as Mp1/1, M1/1 and M5/1 related to the side element Lf1, are additionally applied. As a result of having the uniformity of plasma current improved, the plasma density uniformity on the wafer surface is also improved. The actual radial dimensions of the various portions of the ring-like conductor having a variable radius are, as shown in the lower right portion of FIG. 2, from Lf1, Lf2, Lf3 and Lf4 in the named order, 163 mm, 159 mm, 157 mm and 155 mm. The optimum values of these dimensions were obtained by repeatedly performing the circuit computation of FIG. 10.

According to the present embodiment, since the current non-uniformity of the inner circumference coil does not so much have a great influence on the etching uniformity, the details of the computation is not disclosed. In order to compensate for the non-uniformity of the inner circumference coil, for example, a ring-like conductor 8a shown in FIG. 3 is used to uniformize the plasma current portion generated by the inner circumference coil via a similar principle.

The ring-like conductor having the shape illustrated in FIG. 3 is referred to in describing the present embodiment, but if the ring-like conductor is divided into a main body and exchangeable adjustment rings, the present conductor can more conveniently by adjusted to cope with actual operation conditions and differences between respective devices.

Figure 11:
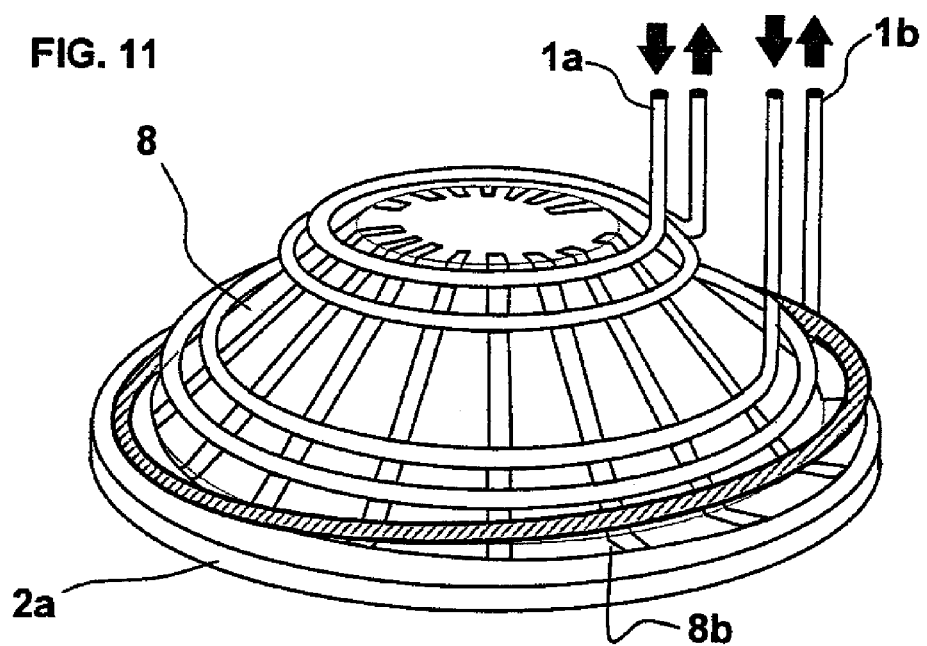
FIG. 11 is a view illustrating another embodiment of the ring-like conductor according to the present invention.
Figure 12:
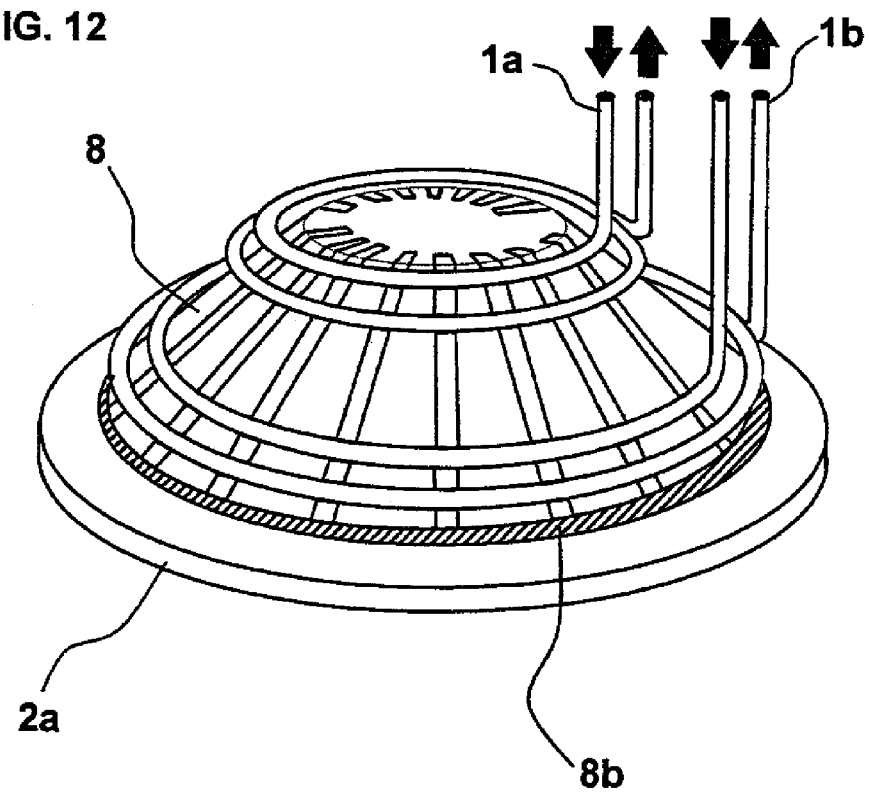
FIG. 12 is a view illustrating yet another embodiment of the ring-like conductor according to the present invention.

The present embodiment had been described taking as an example a plate-like ring having the inner radius or the outer radius varied to correspond to the circumferential positions, but any other ring-like conductor having the mutual inductances among the circumferential segmental elements of the ring-like conductor, the coil element and plasma element varied to correspond to the circumferential positions, it becomes possible to uniformize the plasma based on the principles of the present invention. For example, the outer ring-like conductor 8b can adopt a simple shape as shown in FIG. 11 with a constant radius and width, and capable of having the height position thereof varied to correspond to the circumferential positions. Furthermore, as shown in FIG. 12, it is possible to arrange a sheet-shaped ring-like conductor as show in FIG. 12 along the tapered surface of the tapered discharge window 2a.

Next, the second embodiment according to the present invention will be described. The second embodiment is related to an embodiment where a planar induction coil is arranged on a planar dielectric window made of quartz.

Figure 13A:
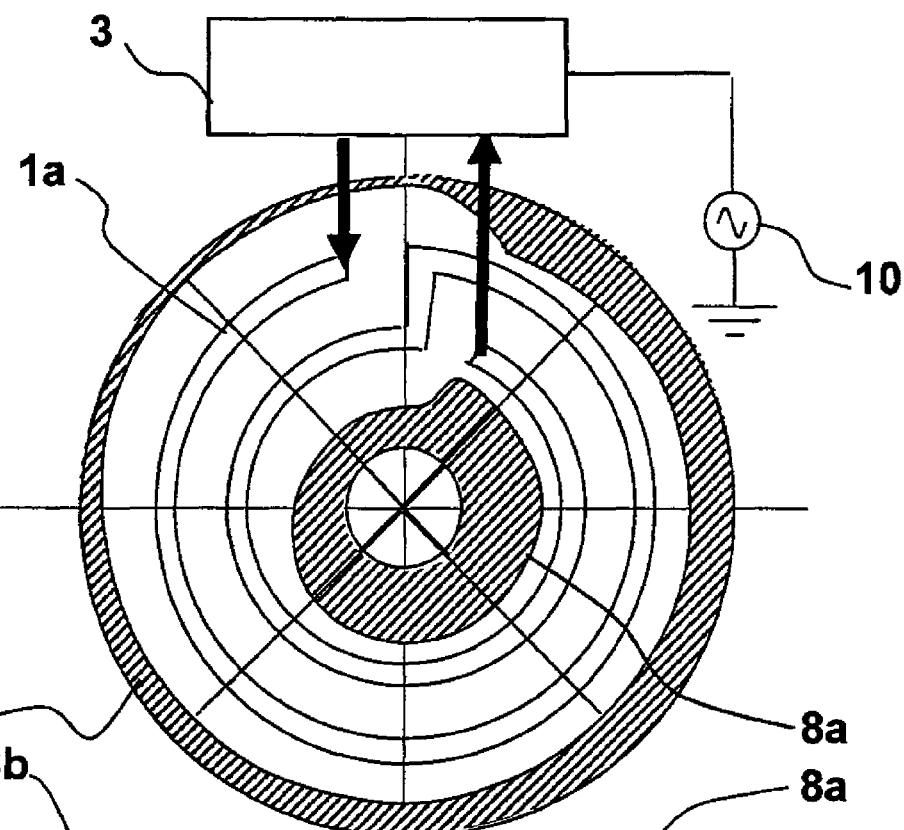
FIG. 13A is a plane view showing the apparatus configuration of a second embodiment according to the present invention.
Figure 13B:
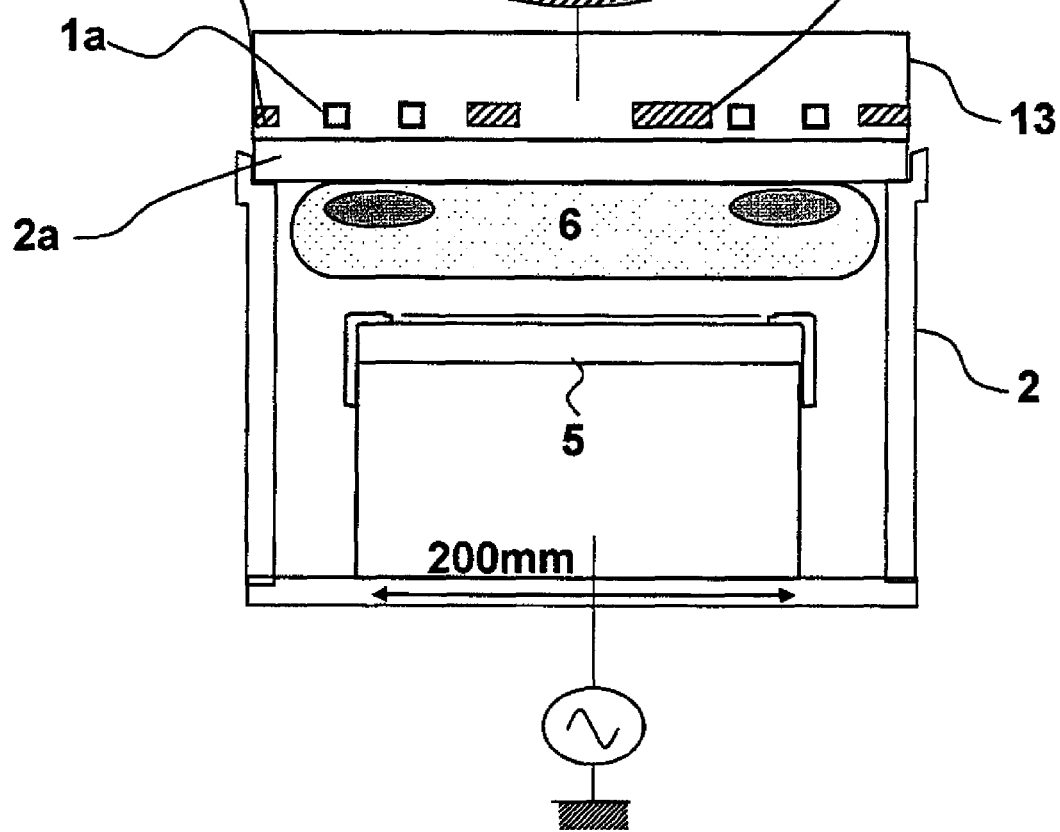
FIG. 13B is a cross-sectional view showing the apparatus configuration of the second embodiment according to the present invention.

FIG. 13 shows the whole structure of the second embodiment. FIG. 13A is a planar view of the second embodiment, and FIG. 13B is a cross-sectional side view thereof. A two-turn induction coil 1a is disposed on the planar dielectric window 2a. The shape of the compensation ring can either be similar to the ring-like conductor 8a or 8b. As for the outer compensation ring 8b, it is electrically connected to a conductor cover 13 covering the whole coil chamber. The present embodiment does not include a Faraday shield as shown in embodiment 1. At this time, the equivalent circuit as shown in FIG. 4 and FIG. 10 can be used, but the computation should be performed by changing the definition of the stray capacitance (C1 through C9) between the coil and the Faraday shield to the stray capacitance between the coil and the plasma.

At first, FIG. 14 illustrates the current distribution in the coil and the current distribution in the plasma where the compensating ring-like conductor is not disposed. The non-uniformity of the coil current and plasma current according to this example is greater than that of first example (the coil current of FIG. 3A and the plasma current distribution of FIG. 5A) This is caused by the exemplified arrangement of FIG. 13 having the coil 1a disposed in close contact with the dielectric window 2a, by which the stray capacitance between the coil and plasma becomes, namely, according to the first embodiment, the stray capacitance between the inner circumference coil and the Faraday shield is approximately 30 pF, whereas according to the second embodiment, the stray capacitance between the coil and plasma becomes as high as approximately 100 pF since the dielectric window 2a is disposed therebetween.

FIG. 15 shows the coil current distribution, the plasma current distribution and the distribution of current flowing in the outer circumference of the compensating ring-like conductor when only the inner ring-like conductor 8a out of the compensating ring-shaped conductors is disposed. It can be seen that the non-uniformity of distribution of the coil current itself is not improved compared to FIG. 14, but the plasma current distribution has become uniform. Further, it can be seen that the current distributed in the circumferential direction is flown in the outer circumference of the compensating ring-like conductor 8a. This is because a compensating ring-like conductor 8a having an outer diameter varied to correspond to the circumferential positions is disposed, so that the mutual induction inductances among the compensating ring-like conductor, the induction coil and the plasma varies according to position, and as a result, the plasma current is made uniform.

FIG. 16 shows the coil current distribution, the plasma current distribution and the distribution of current flowing in the inner circumference of the compensating ring-like conductor when only the outer ring-like conductor 8b out of the compensating ring-shaped conductors is disposed. It can be seen that similar to the example of FIG. 15, the non-uniformity of distribution of the coil current itself is not improved compared to FIG. 14, but the plasma current distribution has been uniform. Further, it can be seen that the current distributed in the circumferential direction is flown in the inner circumference of the compensating ring-like conductor 8b. This is realized by a principle similar to that described with respect to FIG. 1, and the mutual inductances varied according to position contributes to uniformized the plasma current distribution.

As described, according to the present invention, the non-uniformity of the plasma current in the circumferential direction caused by the existence of stray capacitance of the induction coil can be improved greatly by disposing a compensating conductor ring near the coil.

What is claimed is:

1. A plasma processing apparatus comprising:
   a vacuum processing chamber for generating plasma in the interior thereof;
   a means for introducing gas into the vacuum processing chamber;
   a stage which is disposed in the vacuum processing chamber, the stage being configured for placement of a sample on the stage;
   an insulating dielectric window which is disposed at an upper area of the vacuum processing chamber;
   a coil-like induction antenna which is disposed above the dielectric window and which irradiates an induction magnetic field; and
   a high frequency power supply which supplies a high frequency power to the induction antenna via a matching box;
   wherein the plasma processing apparatus further comprises a first conductor which is disposed above the dielectric window and which is disposed around a periphery of the induction antenna,
   the first conductor has a closed ring shape,
   a width of the first conductor gradually increases along a circumference thereof from a power supply end of the induction antenna towards a terminal end of the induction antenna, and
   the width of the first conductor is minimum at the power supply end of the induction antenna, and the width of the first conductor is maximum at the terminal end of the induction antenna.

2. The plasma processing apparatus according to claim 1, wherein
   the plasma processing apparatus further comprises a second conductor which is disposed above the dielectric window, a periphery of the second conductor being surrounded by the induction antenna,
   the second conductor has a closed ring shape,
   a width of the second conductor gradually increases along a circumference thereof from a power supply end of the induction antenna towards a terminal end of the induction antenna, and
   the width of the second conductor is minimum at the power supply end of the induction antenna, and the width of the second conductor is maximum at the terminal end of the inner induction antenna.

3. The plasma processing apparatus according to claim 1, wherein the insulating dielectric window seals the vacuum processing chamber airtightly.

4. The plasma processing apparatus according to claim 1, wherein neither the first conductor nor the second conductor are connected to a power supply.

5. A plasma processing apparatus comprising:
   a vacuum processing chamber configured to generate plasma in an interior thereof;
   a gas supply configured to introduce gas into the vacuum processing chamber;
   a stage disposed in the vacuum processing chamber, the stage being configured for placement of a sample on the stage;
   an insulating dielectric window disposed at an upper area of the vacuum processing chamber;
   a coil-like induction antenna disposed above the dielectric window; and
   a high frequency power supply configured to supply high frequency power to the induction antenna via a matching box;
   wherein the plasma processing apparatus further comprises a first conductor disposed above the dielectric window, the first conductor being disposed around a periphery of the induction antenna,
   the first conductor has a closed ring shape,
   a width of the first conductor gradually increases along a circumference thereof from a power supply end of the induction antenna towards a terminal end of the induction antenna, and
   the width of the first conductor is minimum at the power supply end of the induction antenna, and the width of the first conductor is maximum at the terminal end of the induction antenna.

6. The plasma processing apparatus according to claim 5, wherein
   the plasma processing apparatus further comprises a second conductor disposed above the dielectric window, a periphery of the second conductor is surrounded by the induction antenna,
   the second conductor has a closed ring shape,
   a width of the second conductor gradually increases along a circumference thereof from a power supply end of the induction antenna towards a terminal end of the induction antenna, and
   the width of the second conductor is minimum at the power supply end of the induction antenna, and the width of the second conductor is maximum at the terminal end of the induction antenna.

7. The plasma processing apparatus according to claim 5, wherein neither the first conductor nor the second conductor are connected to a power supply.

* * * * *